United States Patent [19]
Guckel et al.

[11] Patent Number: 6,133,615
[45] Date of Patent: Oct. 17, 2000

[54] PHOTODIODE ARRAYS HAVING MINIMIZED CROSS-TALK BETWEEN DIODES

[75] Inventors: Henry Guckel; Shamus P. McNamara, both of Madison, Wis.

[73] Assignee: Wisconsin Alumni Research Foundation, Madison, Wis.

[21] Appl. No.: 09/059,141

[22] Filed: Apr. 13, 1998

[51] Int. Cl.[7] ........................ H01L 31/068; H01L 27/146
[52] U.S. Cl. ........................ 257/446; 257/466; 257/292; 257/506
[58] Field of Search .................................. 257/292, 446, 257/466, 506

[56] References Cited

U.S. PATENT DOCUMENTS

| | | |
|---|---|---|
| 3,604,941 | 9/1971 | Crown . |
| 3,757,128 | 9/1973 | Vermeulen . |
| 3,855,608 | 12/1974 | George et al. . |
| 3,943,367 | 3/1976 | Baker . |
| 4,117,320 | 9/1978 | Tomlinson et al. . |
| 4,259,570 | 3/1981 | Leonard . |
| 4,266,125 | 5/1981 | Epstein et al. . |
| 4,275,404 | 6/1981 | Cassiday et al. . |
| 4,293,877 | 10/1981 | Tsunekawa et al. . |
| 4,341,956 | 7/1982 | Bax . |
| 4,451,731 | 5/1984 | Leonard . |
| 4,456,501 | 6/1984 | Bayman et al. . |
| 4,533,430 | 8/1985 | Bower . |
| 4,534,826 | 8/1985 | Goth et al. . |
| 4,612,408 | 9/1986 | Moddel et al. . |
| 4,630,121 | 12/1986 | Suzuki et al. . |
| 4,639,756 | 1/1987 | Rosbeck et al. . |
| 4,675,549 | 6/1987 | Steffe et al. . |
| 4,691,101 | 9/1987 | Leonard . |
| 4,735,908 | 4/1988 | Higashi et al. . |
| 4,763,197 | 8/1988 | Masuda . |
| 4,766,307 | 8/1988 | Pelgrom et al. . |
| 4,857,138 | 8/1989 | Drage et al. . |
| 4,868,622 | 9/1989 | Shigenaka . |
| 4,868,623 | 9/1989 | Nishiura . |
| 4,904,861 | 2/1990 | Epstein et al. . |
| 4,972,244 | 11/1990 | Buffet et al. . |
| 4,998,013 | 3/1991 | Epstein et al. . |
| 5,049,962 | 9/1991 | Huang et al. . |
| 5,061,652 | 10/1991 | Bendernagel et al. . |

(List continued on next page.)

FOREIGN PATENT DOCUMENTS

| | | |
|---|---|---|
| 60-21540 | 2/1985 | Japan . |
| 61-133659 | 6/1986 | Japan . |
| 61-139061 | 6/1986 | Japan ..................................... 257/446 |
| 61-141176 | 6/1986 | Japan . |
| 62-086756 | 4/1987 | Japan . |
| 5-152598 | 6/1993 | Japan ..................................... 257/446 |

OTHER PUBLICATIONS

Jay Sasserath, et al., "DRIE Profile Control Holds Promise for Varied Applications," Micromachine Devices, vol. 2, No. 11, Nov. 1997, pp. 1,4.

*Primary Examiner*—Jerome Jackson, Jr.
*Attorney, Agent, or Firm*—Foley & Lardner

[57] ABSTRACT

Photodiode arrays are formed with close diode-to-diode spacing and minimized cross-talk between diodes in the array by isolating the diodes from one another with trenches that are formed between the photodiodes in the array. The photodiodes are formed of spaced regions in a base layer, each spaced region having an impurity type opposite to that of the base layer to define a p-n junction between the spaced regions and the base layer. The base layer meets a substrate at a boundary, with the substrate being much more heavily doped than the base layer with the same impurity type. The trenches extend through the base layer and preferably into the substrate. Minority carriers generated by absorption of light photons in the base layer can only migrate to an adjacent photodiode through the substrate. The lifetime and the corresponding diffusion length of the minority carriers in the substrate is very short so that all minority carriers recombine in the substrate before reaching an adjacent photodiode.

36 Claims, 6 Drawing Sheets

U.S. PATENT DOCUMENTS

| | | |
|---|---|---|
| 5,118,383 | 6/1992 | Engelhardt . |
| 5,391,236 | 2/1995 | Krut et al. . |
| 5,409,563 | 4/1995 | Cathey . |
| 5,426,626 | 6/1995 | Katayama ............................... 257/446 |
| 5,430,321 | 7/1995 | Effelsberg . |
| 5,438,217 | 8/1995 | Ishaque et al. . |
| 5,444,007 | 8/1995 | Tsuchiaki . |
| 5,466,630 | 11/1995 | Lur . |
| 5,500,376 | 3/1996 | Ishaque et al. . |
| 5,501,893 | 3/1996 | Laermer et al. . |
| 5,658,472 | 8/1997 | Bartha et al. . |

PHOTODIODE ARRAYS HAVING MINIMIZED CROSS-TALK BETWEEN DIODES

FIELD OF THE INVENTION

This invention pertains generally to the field of photodetectors and particularly to photodiode arrays, and to structures such as optical encoders that utilize photodetector arrays.

BACKGROUND OF THE INVENTION

Arrays of photosensitive diodes are used in various applications including radiation detectors, imagers and optical position encoders. The arrays may be formed as one- or two-dimensional arrays of aligned photodiodes, or, for optical shaft encoders, a circular or semicircular arrangement of diodes.

A significant and well recognized problem associated with photodiode arrays is "cross-talk" occurring because of minority carrier leakage current between lit and unlit diodes. Such cross-talk can be particularly troublesome in photodetector arrays for optical encoders. Various approaches have been used to minimize such cross-talk, including providing inactive photodiodes to balance the leakage current, as described in U.S. Pat. Nos. 4,904,861 and 4,998,013 to Epstein, et al.

The problem of cross-talk between diodes in arrays for optical encoders becomes even more acute as the size of the encoder arrays and the relative size and spacing of the diodes is reduced. For micromechanical applications, it would be desirable to produce optical shaft position encoders having lateral dimensions of a few millimeters or even less. To obtain the desired precision angle measurements from the output of an encoder in this size range, the diodes in the arrays must be small and spaced closely together, e.g., with typical diode widths in the range of a few microns or tens of microns and spacing between adjacent diodes of a few microns. At the typical doping levels utilized for the base layer of semiconductor in diode arrays of this type, the diffusion length of minority carriers generated by photon interaction in the semiconductor is in the range of at least many tens of microns, and such minority carriers have the potential to affect signals at diodes several hundreds of microns away from the region at which the minority carriers were generated. Consequently, as the size of the photodiode arrays is reduced, the cross-talk problem becomes much more severe.

The use of trenches, moats or insulating structures between photodiodes or other active devices to provide isolation between the devices is known. See, e.g., the U.S. Pat. Nos. 4,639,756 to Rosbeck, et al., 4,868,622 to Shigenaka, 4,868,623 to Nishiura, 5,049,962 to Huang, et al., 5,061,652 to Bendernagel, et al., 5,391,236 to Krut, et al., 5,430,321 to Effelsberg, and 5,438,217 and 5,500,376 to Ishaque, et al. However, such prior approaches are typically not well suited to forming closely spaced miniaturized diode arrays, wherein the spacing between diodes should be in the range of a few microns, or require complex processing steps including passivation of p-n junctions exposed by the trenches between the active devices.

SUMMARY OF THE INVENTION

In accordance with the present invention, photodiode arrays can be formed with close diode-to-diode spacing without cross-talk between diodes in the array. The photodiodes, and preferably other active devices formed on a semiconductor substrate with the diodes, are isolated from one another so as to essentially eliminate minority carrier leakage current between the diodes and between the diodes and other active devices on the substrate. Such isolation allows individual diodes to be formed on a monolithic semiconductor substrate using efficient, cost-effective standard semiconductor processing.

Isolated photodiode structures in accordance with the invention include a semiconductor substrate, such as crystalline silicon, that is doped to a high doping level of a selected impurity type, and a semiconductor base layer on the substrate that has the same impurity type as the substrate and is at a lower doping density than the substrate. The substrate and base layer may be formed of the same semiconductor materials, such as crystalline silicon, with a boundary between the substrate and an epitaxial base layer at which the doping level of the material changes. At least two spaced semiconductor regions are formed in the base layer and are doped with an impurity type opposite to the impurity type of the base layer to define a p-n junction with the base layer at the boundary between each spaced region and the base layer. The adjacent regions may be closely spaced, with the distance between the regions in the order of a few microns, e.g., 5 to 10 microns or less. A trench is formed through the base layer between adjacent spaced regions, extending at least to the boundary between the base layer and the substrate, and is spaced from the p-n junctions defined between the base layer and the spaced regions so that the trench does not expose a p-n junction. The trench preferably has essentially vertical, parallel sidewalls with a high aspect ratio—the ratio of height to width—and the trench preferably extends partially into the substrate. Where micro-photodiode arrays are formed, the trench preferably has a narrow width in the range of a micron or a few microns. The substantially vertical sidewalls of the trench minimize stray photon absorption at the sidewalls and allow closer spacing of adjacent diodes than would be possible with conventionally etched trenches with sloping sidewalls. The thickness of the base layer is preferably on the order of the absorption length of light to which the photodiodes are to respond so that essentially all of the incident light is absorbed in the base layer.

Minority carriers generated in the base layer adjacent to the p-n junction between a spaced semiconductor region and the base layer will be able to migrate to the p-n junction because the distance from the bottom of the base layer to the p-n junction is much less than the diffusion length provided by the relatively low doping density in the base layer. Minority carriers are prevented by the trench from migrating directly in the base layer to the p-n junctions defined between other spaced regions and the base layer. The diffusion length in the much more highly doped substrate is much shorter than in the base layer, and the width of the trench, or the width of the trench combined with the depth by which the trench extends beyond the base layer/substrate boundary into the substrate, is preferably substantially greater than the diffusion length in the substrate so that the minority carriers that move through the substrate under the trench will essentially all be recombined. Consequently, the leakage current between lit and unlit photodiodes is reduced essentially to zero.

The invention may be incorporated into photodiode arrays for optical encoders, such as shaft encoders, with the diodes arranged in a circular or semicircular progression. The adjacent diodes may be isolated from one another by a trench that is formed entirely around each spaced region, or that is formed partially around the spaced regions to positions which force the minority carriers to travel a path that is long enough to exceed the diffusion length of the minority carriers in the materials through which the carriers pass.

It is a particular advantage of the isolation trenches in accordance with the present invention that because the trenches do not cut through or expose a p-n junction, no passivation of the trench walls or bottom is required. By utilizing isolation trenches with essentially parallel sidewalls which are also perpendicular to the top surface of the base layer, no passivation or covering of the walls of the trench is required to avoid unwanted generation of charge carriers at the trench walls or bottom. With substantially parallel, flat, vertical sidewalls, the light incident on the array that passes into the trench will essentially all fall onto the bottom of the trench. Any minority carriers generated at the bottom of the trench will rapidly recombine in the highly doped substrate material and will not be able to diffuse to either of the adjacent p-n junctions. Such flat, parallel walled trenches may be produced utilizing etching techniques such as deep reactive ion etching.

Preferably, in the method of producing photodiode arrays in accordance with the invention, the steps of forming the base layer on the substrate, forming the spaced regions in the base layer to define the p-n junctions, providing an insulation layer on the surface of the base layer with openings for metal contacts, and depositing of metal conductors onto the top surface to make contact with the openings in the insulation layer, is carried out before the trenches are formed. Because the trenches formed in accordance with the invention do not cut through a p-n junction, they do not need to be passivated, and thus no high temperature passivation step for the trench walls is required after the trenches are formed. Lower temperature annealing may be carried out after formation of the trenches if desired without affecting the active devices or metal conductors previously formed.

Further objects, features and advantages of the invention will be apparent from the following detailed description when taken in conjunction with the accompanying drawings.

DETAILED DESCRIPTION OF THE INVENTION

Figure 1:
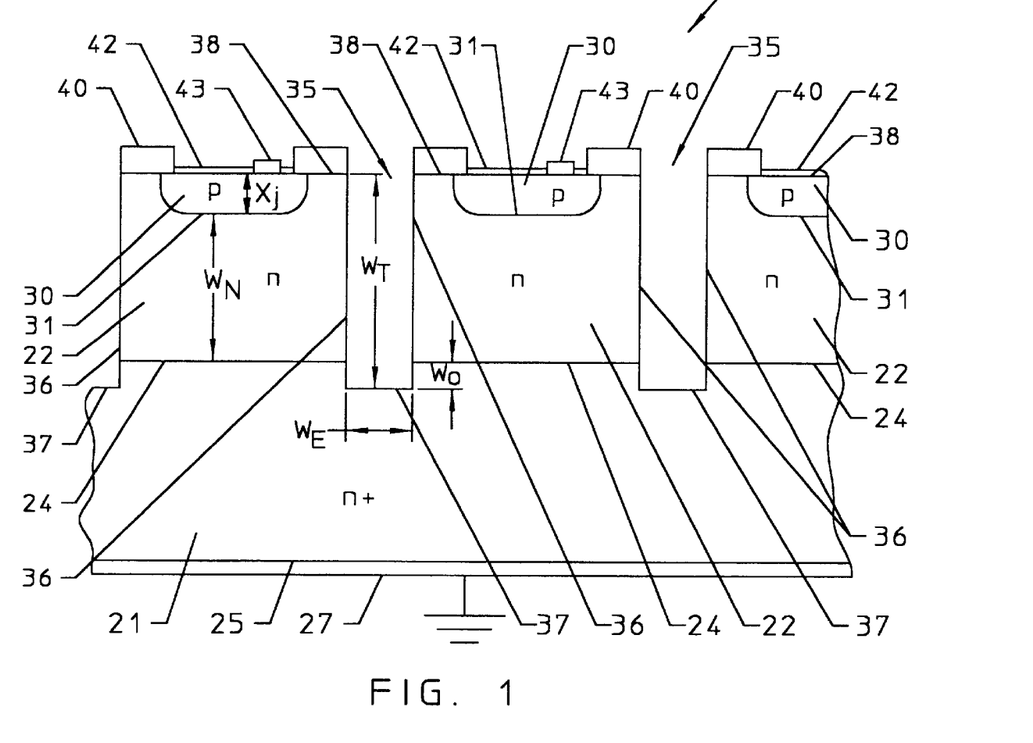
FIG. 1 is a simplified cross-sectional view through a semiconductor structure providing isolated photodiodes in accordance with the invention.

With reference to the drawings, a photodiode array structure with isolation of the diodes to prevent minority carrier leakage current is shown generally at 20 in FIG. 1 in an illustrative cross-section. The photodiode array structure 20 has a substrate 21 which is heavily doped with an impurity of a selected type, either n-type or p-type (illustratively shown as n+ in FIG. 1). The substrate 21 is formed of a semiconductor, such as single crystal silicon (although it is understood that other semiconductors may also be utilized in accordance with the invention). A base layer 22, preferably formed of the same semiconductor material as the substrate 21, is formed on the substrate and meets the substrate at a boundary 24. The base layer 22 has a much lower doping density of the same type of impurity as the substrate 21, either n-type or p-type, and preferably shares the same crystalline structure as the substrate. For example, the base layer 22 may be grown as an epitaxial layer on top of a substrate 21 comprising a wafer of single crystal silicon or other semiconductor. For illustration in FIG. 1, the back surface or side 25 of the substrate 21 has a metal layer 27 formed thereon which can form one contact for all of the diodes in the photodiode array (and which may be grounded as illustrated in FIG. 1).

Figure 2:
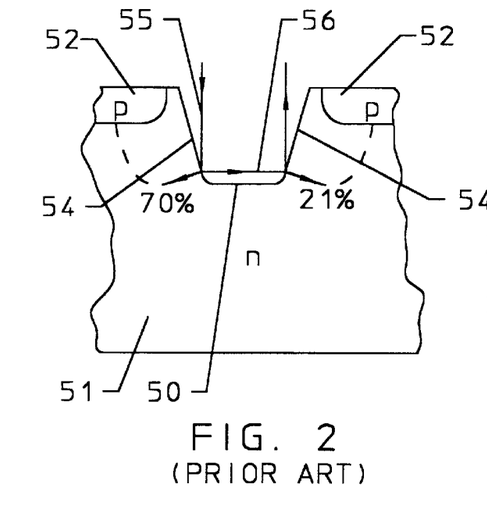
FIG. 2 is a simplified cross-sectional view of a trench type isolation structure in accordance with the prior art illustrating a path of light photons striking the walls of the trench.

Spaced regions 30 of semiconductor are formed in the base layer 22 and are doped with an impurity type that is opposite to the impurity type of the doping of the base layer 22 (p-type dopant as shown in FIG. 1 for the regions 30 and n-type doping for the base layer 22). The boundary 31 between the base layer 22 and each spaced region 30 defines a p-n junction. A trench 35, having side walls 36 and a bottom wall 37, is formed in the base layer 22 and extends from the top surface 38 of the base layer through the base layer at least to the boundary 24 and preferably past the boundary 24 partially into the substrate 21. Although only two of the spaced regions 30, with their corresponding p-n junctions 31, are illustrated in FIG. 2, it is understood that a typical array would have many such isolated p-n junctions, defining diodes, that are separated and isolated by the trenches 35. The top surface or side 38 of the base layer 22 is covered by an insulating layer 40, such as silicon dioxide ($SiO_2$) where the base layer 22 is formed of silicon, and preferably an antireflective coating layer 41 (e.g., also of $SiO_2$). Electrical contact conductors 43 may be formed in openings in the insulating oxide 40 and/or in the oxide 42 to provide electrical contact at appropriate positions to the semiconductor regions 30 and thus to the side of the p-n junctions 31 opposite to the side to which electrical connection is provided by the metal layer 27.

For purposes of explaining the invention, the following general dimensions are indicated in FIG. 1: $X_j$=the depth of the oppositely doped spaced regions 30; $W_N$=the distance between the bottom of the regions 30 at the p-n junction 31 and the boundary 24 between the base layer 22 and the substrate 21; $W_T$=the total depth of the trench 35 from the top surface 38 of the base layer 22 to the bottom surface 37 of the trench; $W_E$=the width of the trench 35 at the bottom 37 of the trench; and $W_O$=the depth of the trench from the level of the boundary 24 to the bottom 37 of the trench. Generally, it is preferred that the oppositely doped semiconductor regions 30 be relatively shallow, and typical values for $X_j$ are preferably in the range of 2 $\mu$m or less. It is preferred that the charge carriers be generated by the interaction of light photons with the material of the base layer 22 in the vicinity of the p-n junction 31. To obtain substantially total absorption of photons entering the top surface 38 of the base layer 22, it is preferred that the depth $W_N$ be sufficient so that substantially all of the photons in the wavelengths of interest are absorbed before such photons reach the boundary 24. For example, for a base layer 22 formed of crystalline silicon, and incident light having a wavelength in the range of 800 nm, the absorption length $L_a$ is about 15 $\mu$m. To ensure that essentially all of the incident photons are absorbed, the depth $W_N$ may be selected to be about twice the absorption length or about 30 $\mu$m. Long wavelength light, e.g., red light, is often used in optical encoders because the light emitting diode (LED) light sources commonly used in encoders are most efficient at these wavelengths.

The diffusion length of the minority carriers generated in the lightly doped base layer 22 is proportional to $$\sqrt{D_p \tau_p}$$

where $D_p$ is the diffusion coefficient for the minority carriers (holes for n-type doping of the base layer 22 as illustrated in FIG. 1), and $\tau_p$ is the minority carrier lifetime. Because the doping levels in the base layer 22 are relatively low (e.g., in the range of $10^{15}/cm^3$) the minority carrier lifetime is relatively long. For illustration, the density of holes, p, changes from its equilibrium value, $p_o$, as a result of the action of the incident light to $p_o + \Delta p$. Typically $p_o + \Delta p = 10^{10} p_o$. The hole density will decay to $p_o$ at about $$10 \cdot 3 \cdot \sqrt{D_p \tau_p}$$

distance from the position at which the holes are generated. Typically, this is about 10·3·60 82 m or 1800 $\mu$m in the lightly doped base layer 22. The minority carrier lifetimes increase or decrease roughly in proportion to the doping density. While it would thus be possible to increase the doping of the base layer 22 to shorten the minority carrier lifetime, doing so would tend to reduce the photocurrent generated at the photodiodes formed at the p-n junctions 31 for a given flux of incident light. In the present invention, the base layer 22 is preferably lightly doped to maintain the efficiency of the photodiodes and to provide an effective built-in field that tends to confine the minority carriers to the base layer. Migration of minority carriers between the isolated regions of the base layer defined between the trenches 35 is blocked by the trenches. The minority carriers can migrate toward other p-n junctions only through the heavily doped substrate 21 (e.g., at a doping level of $10^{20}$ to $10^{21}/cm^3$), where the lifetime of such migrating minority carriers is significantly reduced. For example, for a reduction in the minority carrier lifetime of a factor of $10^6$ in the substrate 21 as compared to the base layer 22, the diffusion length in the substrate compared to the base layer is reduced by a factor of $10^3$. For the example above, where the diffusion length is 1600 $\mu$m in the base layer 22, the diffusion length for minority carriers in the substrate 21 is about 1.8 $\mu$m. The minimum length of the path that minority carriers must follow through the substrate material 21 from one isolated section of the base layer 22 to an adjacent isolated section of the layer 22 between the trenches 35 is equal to $2W_o + W_e$. If this distance is made greater than 1.8 $\mu$m, essentially all of the minority carriers generated in one isolated section of the base layer 22 will be recombined before reaching an adjacent isolated section of the base layer. Preferably, for microstructure photodiode arrays in accordance with the invention, the lateral dimensions of the spaced regions are in the range of 2 to 20 microns, the spacing between the spaced regions is in the range of 2 to 10 microns, and the width of the trenches is in the range of 1 to 2 microns.

Figure 3:
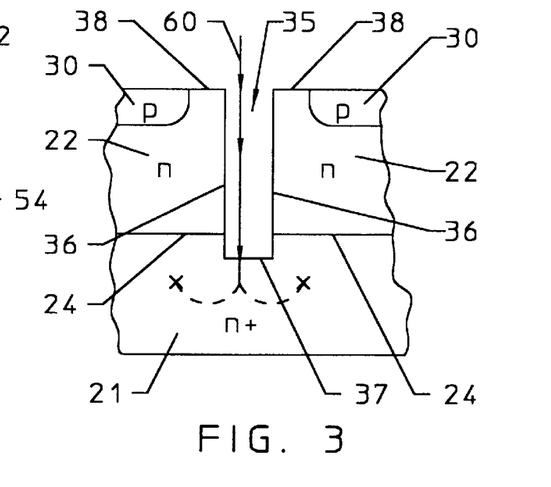
FIG. 3 is a simplified cross-sectional view through the isolated diode array structure of the invention illustrating the path of light photons incident upon the isolation trench.

Preferably, the width $W_E$ of the trench does not increase with the depth $W_T$ of the trench so that the walls 36 are substantially "vertical," that is, parallel to one another, and the sidewalls 36 are preferably perpendicular to the top surface 38 of the base layer. The reason why vertical trench walls are preferred may be illustrated with respect to the views of FIGS. 2 and 3. In FIG. 2, a trench 50 in an n-type substrate 51, formed in accordance with the prior art using common wet etching techniques to separate diodes defined between the substrate 51 and separated regions 52 of opposite conductivity type, has inwardly sloping sidewalls 54 (a sidewall angle of about 57° to horizontal is typical). The trench will thus have a width at its top that will be as great as or greater than the depth of the trench. Thus, for a deep trench (e.g., 30 $\mu$m) the width of the trench and thus the minimum spacing of the diodes cannot be adequately reduced to allow the desired close spacing of the diodes. In addition, light photons entering the trench 50 along a path 56 which intersects the sloping sidewalls 54 will be partially transmitted into the material of the substrate 51 (e.g., about 70 percent) and partially reflected along a path 56 which then intersects the opposite sidewall 54. Some of the photons following the path 56 are absorbed by the material of the substrate 51 (e.g., 21 percent). The charge carriers generated as a result of absorption of photons at the first intersection of the beam path 55 with the sidewall 54 will result in current at the p-n junction on the left side of FIG. 2, while the photons absorbed by the substrate as a result of the interaction of the beam 56 with the opposite sidewall 54 will result in current at the p-n junction on the right-hand side of FIG. 2. Consequently, both of the adjacent diodes will show a detectable current even though the light in the path 55 was most closely adjacent to the left-hand diode 52. In contrast, as illustrated in FIG. 3 for vertical walled trenches 35 in accordance with the invention, light entering the trench 35 on a path 60 will not hit either of the sidewalls 36 but will be incident upon the bottom of the trench 37. The charge carriers generated in the substrate 21 as a result of absorption of the photons entering the substrate at the bottom 37 of the trench will have short lifetimes, and substantially none of these carriers will reach either the left or right p-n junction illustrated in FIG. 3. Consequently, the light incident on the bottom of the trench 37 at any position in the trench will have no effect on the output signal from the photodiodes on either side of the trench.

Figure 4:
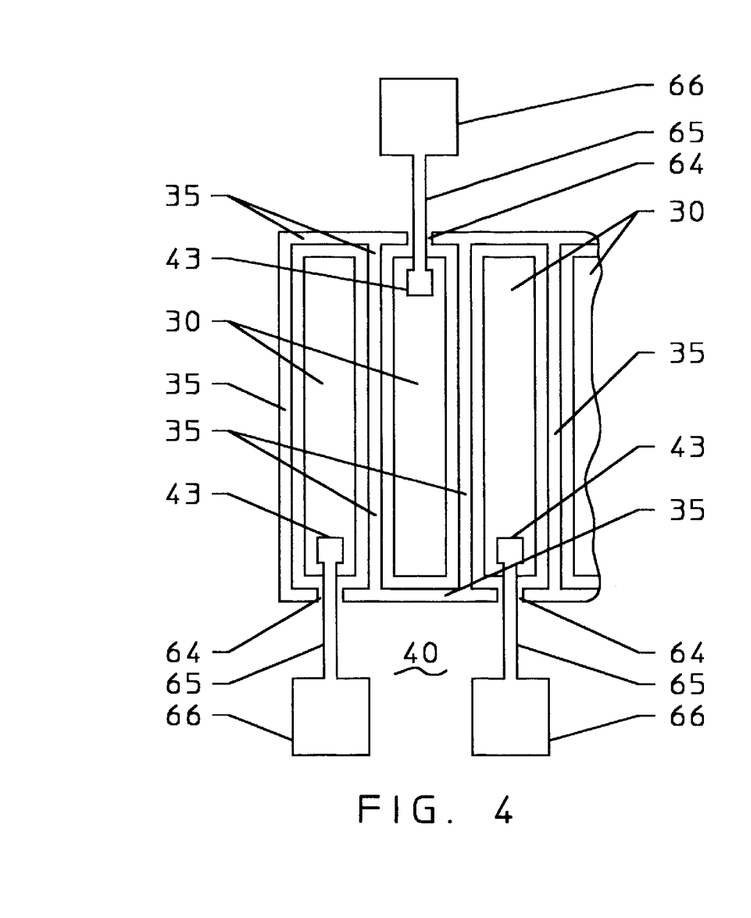
FIG. 4 is a plan view of a portion of an exemplary photodiode array for optical encoders having isolation trenches between photodiodes.

An exemplary layout for a photodiode array for optical encoders is shown in FIG. 4. As illustrated therein, trenches 35 are formed completely around each of the spaced regions 30 except at an opening 64 through which passes a metal conductor 65 which extends to the metal diode contact 43 for each of the diodes. The conductor 65 extends out to a contact pad 66 which allows connection to external circuitry. The distance between the most closely adjacent openings 64 and the size of the openings is such that substantially no minority charge carriers will pass between isolated regions through these openings. The formation of the trenches 35 in this manner allows connection to be made between the regions 30 and an external contact pad 66 by a metal conductor 65 deposited directly on the top insulating layer 40. Alternatively, the trenches 35 can completely surround each of the spaced regions 30, with contact being made to contacts 43 at the top of the regions 30 either by a direct electrical connection to a contact pad formed at the metalization point 43 or by forming a bridge of the conductor 65 over the trench 35.

Figure 5:
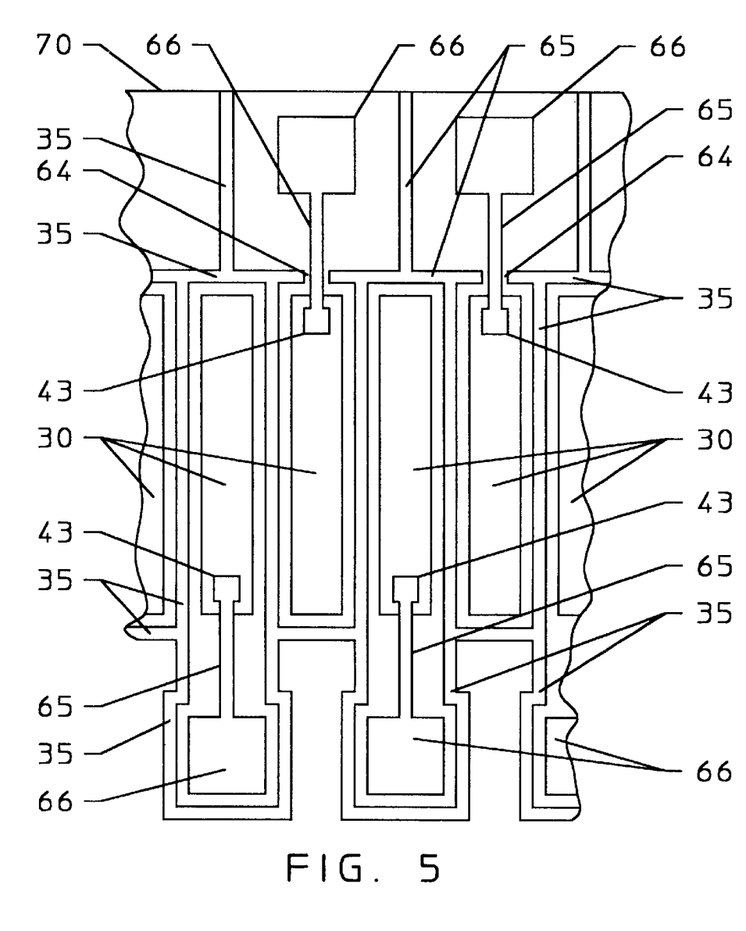
FIG. 5 is a plan view of alternative arrangements of the isolation trenches for a photodiode array in accordance with the invention.

Other alternative layouts for the trenches 35 are illustrated in FIG. 5. On the bottom side of the array shown in FIG. 5 the trenches 35 are illustrated as completely surrounding the metal extension leads 65 and the contact pads 66, thus providing a complete enclosure to prevent minority carriers from migrating from one diode to another. On the top side of the array illustrated in FIG. 5, the trenches 35 extend between the leads 65 and contact pads 66 to an edge 70 of the substrate and base layer, thus again completely isolating the diodes in the array from one another.

The following is an exemplary process sequence for producing isolated photodiode arrays in accordance with the invention.

Figure 6:
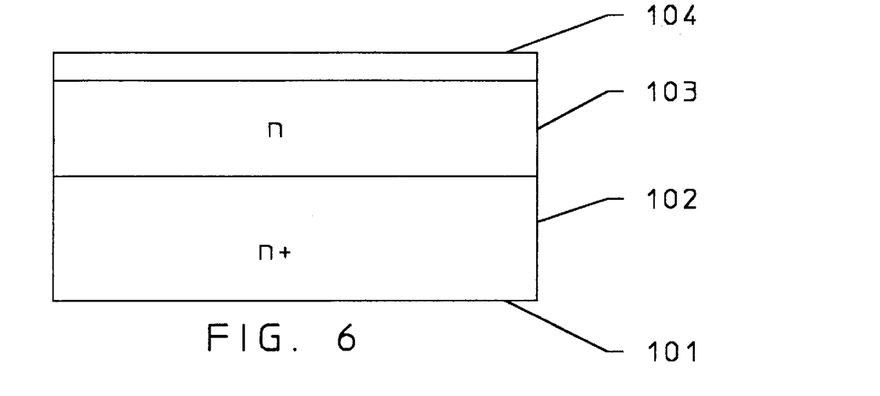
FIGS. 6–16 are illustrative cross-sectional views showing an exemplary sequence of processing steps for preparing arrays of isolated photodiodes in accordance with the invention.

The process begins with selection of heavily n-type silicon wafers 102, e.g., (111), (110) or (100) orientation. An epitaxial base layer 103 is grown on the n+ wafer substrate 102 as generally illustrated in FIG. 6. After the substrate and base layer are formed, the processing steps described below are then carried out.

A standard cleaning cycle is performed, followed by oxide growth, for the field oxide, at 980° C. for 83 minutes wet, to provide an initial field oxide 104 of approximately 5500 Angstroms (Å). The following is the standard cleaning cycle used: soak in sulfuric acid—2 minutes (160°–180° C.), remove, soak in sulfuric acid—2 minutes (160°–180° C.), remove, soak in sulfuric acid—2 minutes (160°–180° C.). Rinse in running deionized water (DI-$H_2O$) for five minutes. Where no oxide is present, etch in 48% HF for two minutes. Where oxide is present, etch in "OXY-35" for 20 seconds. Soak wafers in $NH_4OH$—$H_2O_2$ mixture (60°–70° C.). After insertion, remove beaker from heat and let wafers remain in the solution for a total of ten minutes, rinse in running DI-$H_2O$ for 15 minutes, dry wafers, then oxidize immediately. The OXY-35 oxide etch procedure is as follows: weigh 227 grams of $NH_4F$ in a plastic container. Pour $NH_4F$ into 340 cc of DI-$H_2O$ in a Teflon beaker. This will make 500 cc of stock solution. Measure 200 cc of stock solution into a 400 cc Teflon beaker. (136 g $H_2O$, 91 g $NH_4F$). Add 35 cc HF. Etch with Teflon holder or PCV holder. At 20° C., etch rate is approximately 15 Å/second.

Figure 7:
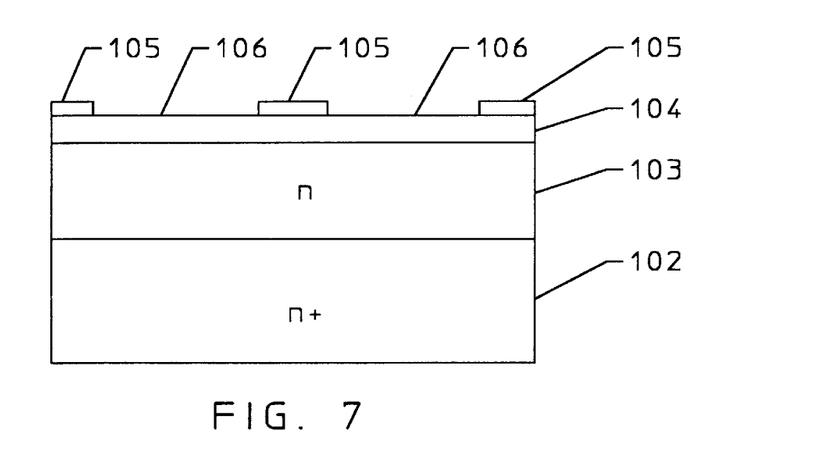

A photoresist (Shipley 1813), is then spun on at 5000 RPM for 30 seconds, followed by a prebake at 90° C. for 30 minutes, to provide a photoresist layer 105. The first mask is then aligned and exposed (for forming the P-region diodes) followed by a development step (MF-321, 45 seconds, 45 seconds) to leave open areas 106 (FIG. 7), followed by a postbake at 125° C. for 30 minutes.

Figure 8:
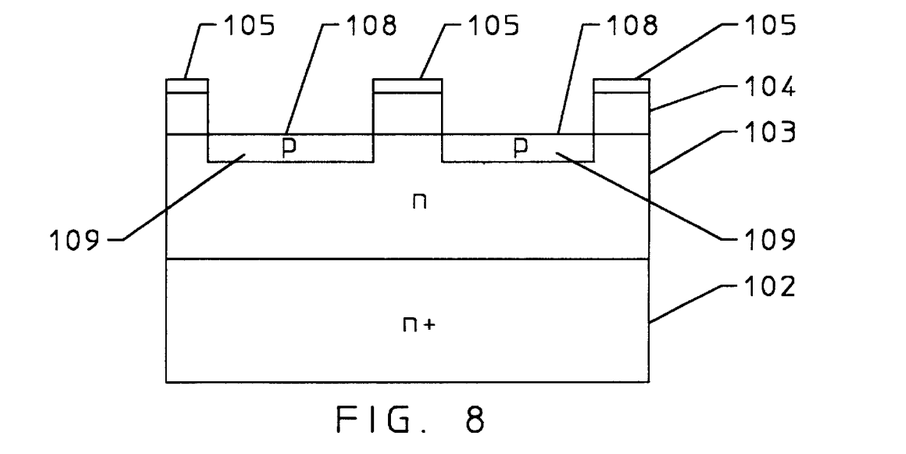

Following the postbake, an oxide etch (in OXY-35) is carried out for 6 minutes to etch the oxide at openings 108 (FIG. 8). Ion implantation of boron, 40 keV, $5\times10^{14}$ $cm^{-2}$, is then carried out to provide p regions 109 in the n-type layer 103. This is followed by plasma ash, $O_2$, 800 W, 8 minutes, 8 minutes, or until done. This is followed by a Piranha bath (4:1 mixture of $H_2SO_4$ and $H_2O_2$), 130° C., 10 minutes, rinse in deionized water, a standard cleaning cycle (15 seconds, 50:1 $H_2O$:HF dip), and a dehydration bake, 700° C., for 30 minutes.

Figure 9:
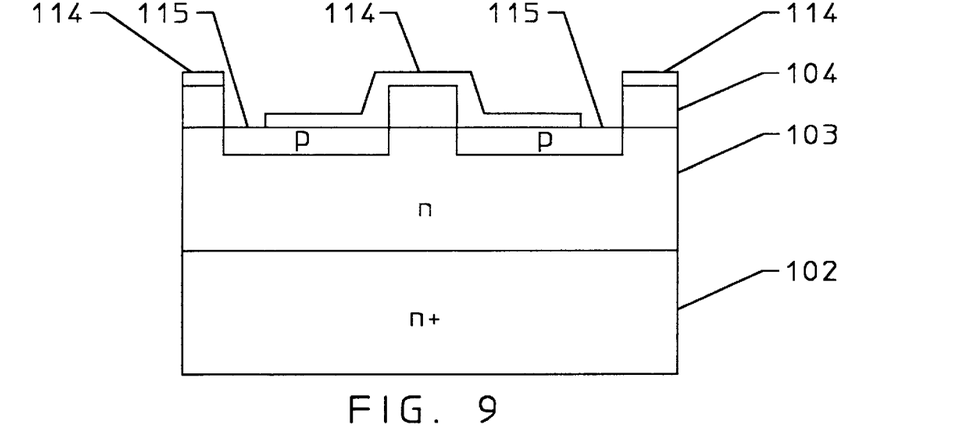

The process continues by applying photoresist, Shipley 1813, spun on at 5000 RPM for 30 seconds, followed by a prebake, 90° C. for 30 minutes, alignment and exposure of a mask for p+ diode contact regions (this step may be skipped if the diode implant is deep enough), development with MF-321, 45 seconds, 45 seconds, and a postbake, 125° C. for 30 minutes, to leave photoresist regions 114 as shown in FIG. 9 with open areas 115 between the photoresist.

Figure 10:
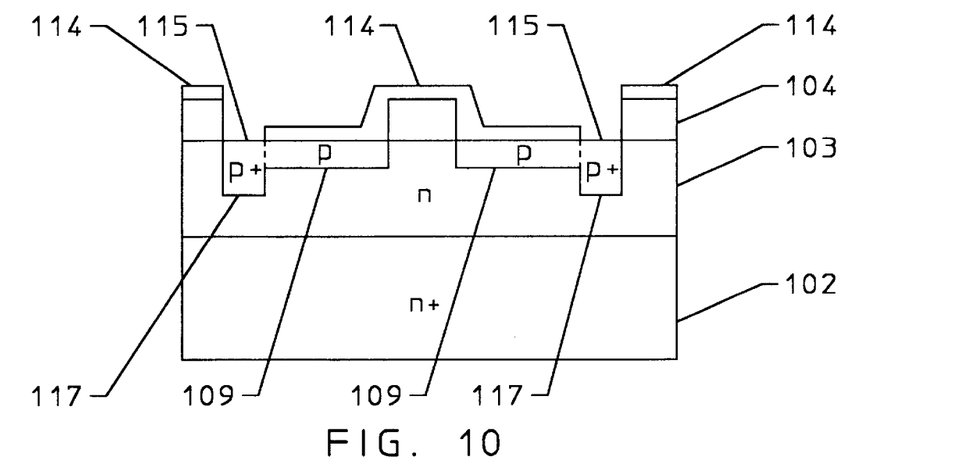
Figure 11:
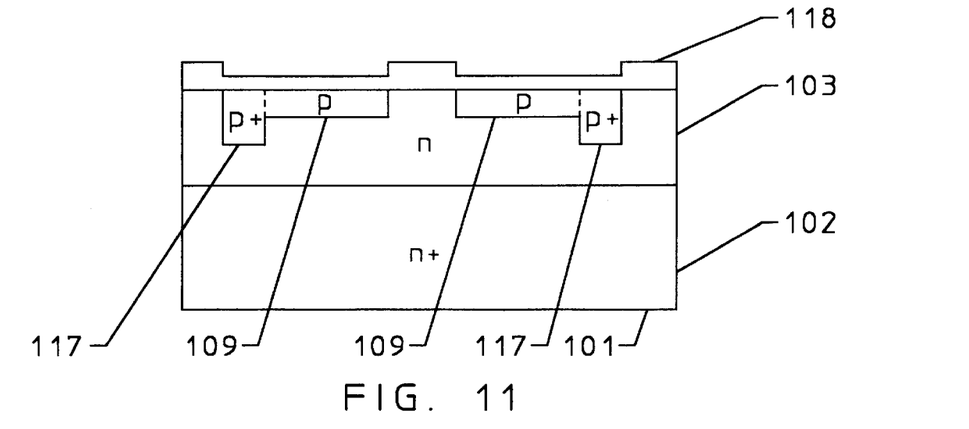

P-type ion implantation is then carried out with boron at 150 keV, $2\times10^{15}$ $cm^{-2}$ into the open areas 115 to provide p+ regions 117 in the n-type layer 103, as shown in FIG. 10. This process is then followed by plasma ash, $O_2$, 800 W, 8 minutes, 8 minutes, or until done, a Piranha bath, 130° C. for 10 minutes, followed by a standard cleaning cycle (15 seconds, 50:1 $H_2O$:HF dip), and oxide growth of the anti-reflection coating, 980° C. for 9 minutes, wet). The result is an oxide layer 118 as shown in FIG. 11 having a field oxide thickness of 6000 Å, and an antireflection oxide thickness of 1500 Å.

Figure 12:
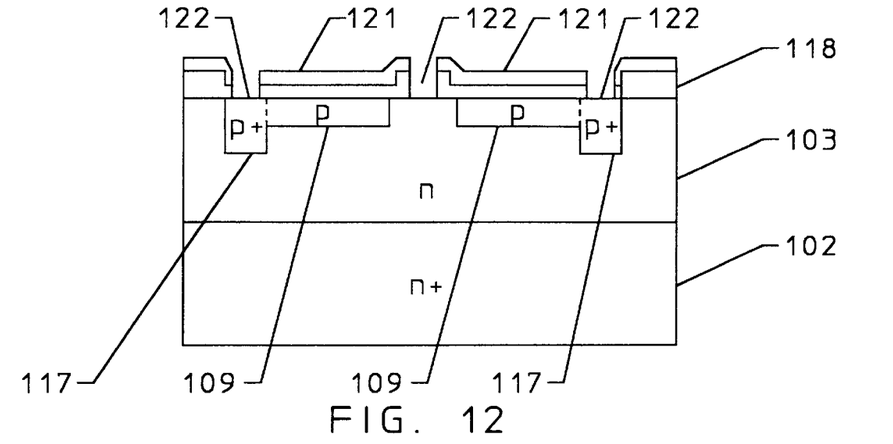

The process then proceeds by applying photoresist, Shipley 1813, spun on at 5000 RPM for 30 seconds, prebake at 90° C. for 30 minutes, alignment and exposure of a mask for contact openings, development with MF-321, 45 seconds, 45 seconds, postbake at 125° C. for 30 minutes, and oxide etch, OXY-35, for 2 minutes to leave a photoresist layer 121 as shown in FIG. 12, with openings 122 extending through the photoresist 121 and the oxide layer 118 to the underlying p+ regions.

Figure 13:
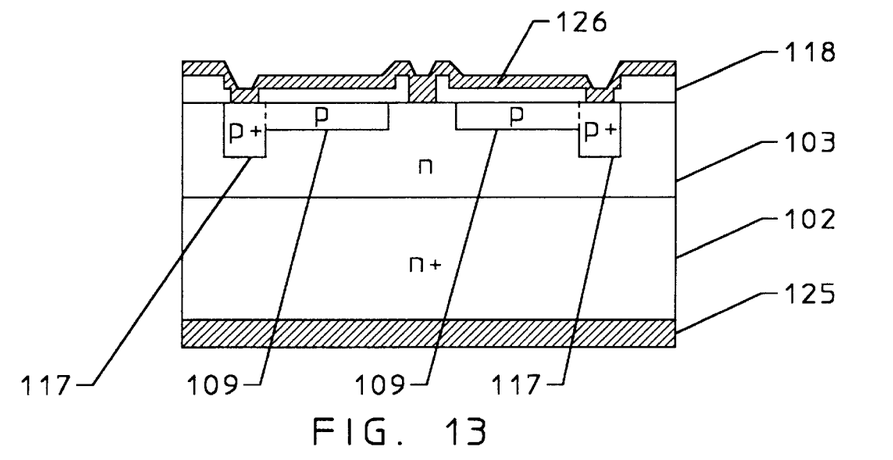
Figure 14:
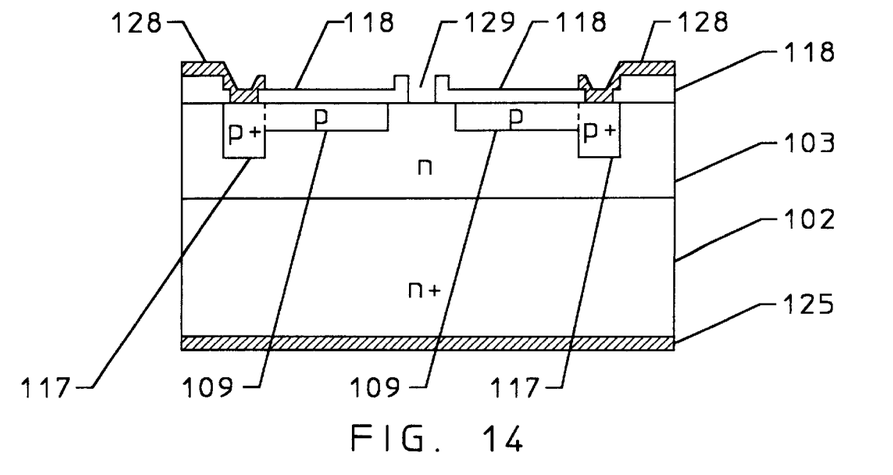

This process is followed by a Piranha bath, 130° C., for 10 minutes, a pre-ohmic cleaning, and sputtering of aluminum, 3 times on the back side 101 of the substrate 102 to form a thick layer 125 as shown in FIG. 13, and once on the front side of the substrate to form a layer 126. Annealing is then carried out in forming gas (9.89% $H_2$, remainder $N_2$) at 460° C. for 30 minutes. This is followed by application of photoresist, Shipley 1813 spun on at 5000 RPM for 30 seconds, prebake at 90° C. for 30 minutes, alignment exposure of a mask for the metal controls and development with MF-321 for 45 seconds, 45 seconds. This is followed by a postbake at 125° C. for 30 minutes, application of an aluminum etchant, a photoresist strip, 1165, for 10 minutes at 75–80° C., to provide the structure shown in FIG. 14 having patterned aluminum contact structures 128 in contact with the underlying p+ regions. Openings 129 are left in the oxide 118 where trenches are to be formed.

Figure 15:
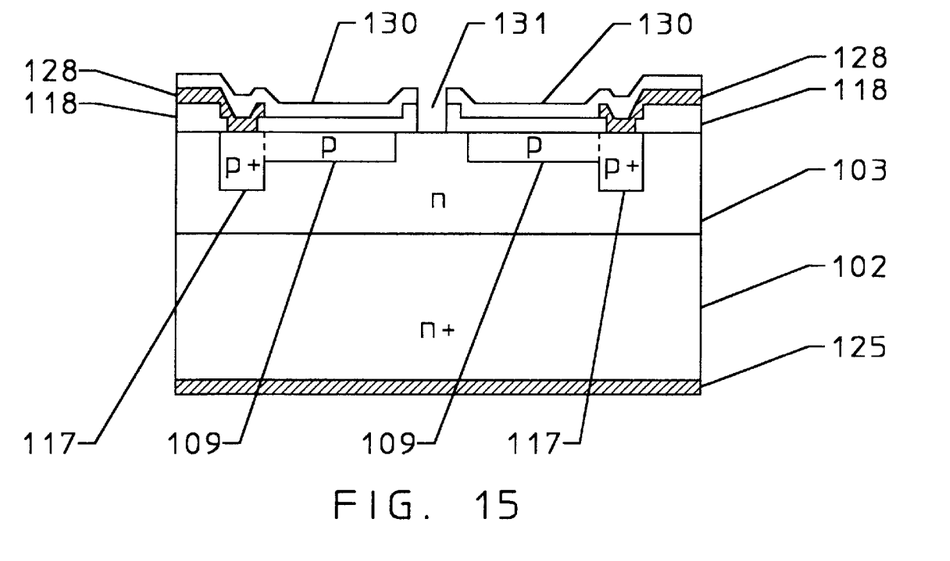
Figure 16:
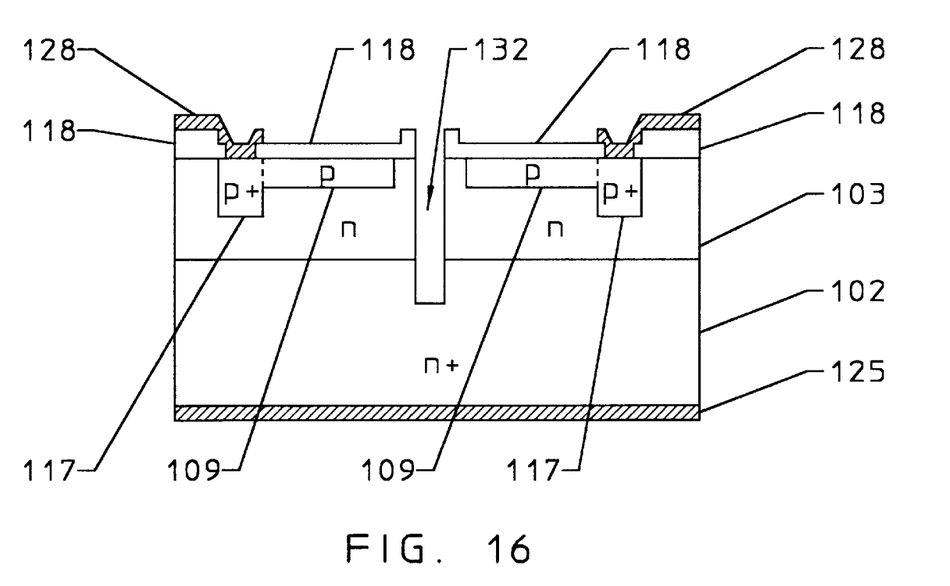

The process then continues by applying photoresist, Shipley 1813, spun on 5000 RPM for 30 seconds, prebake at 90° C. for 30 minutes, alignment and exposure of the trench mask, development in MF-321 for 45 seconds, 45 seconds, and postbake at 125° C. for 30 minutes to provide a photoresist layer 130 covering the structures on the substrate except in regions 131 which are open to the underlying base layer 103 as shown in FIG. 15. The wafers are then subjected to deep reactive ion etching to etch out the trenches in the regions 131 to leave an open trench 132 which extends through to the n+ substrate layer 102 as shown in FIG. 16. Suitable controlled deep reactive ion etching may be carried out using commercially available equipment, e.g., a Plasma Therm ICP system from Plasma Therm, Inc., and as described in U.S. Pat. No. 5,501,893 and generally in the article by Jay Sasserath, et al., "DRIE Profile Control Holds Promise for Varied Applications," Micromachine Devices, Vol. 2, No. 11, November, 1997, pp. 1, 4. Such reactive ion etching also deposits a polymer coating on the sidewalls as the etch progresses which provides incidental protection of the walls of the trench from contamination. If desired, a relatively low temperature annealing cycle (e.g., at 460° C.) can then be performed to relieve any stresses built up in the trench walls and minimize leakage current at the walls of the trenches.

Other active devices, such as bipolar junction transistors, FETs, CMOS devices, etc., may be formed along with the diodes on the base layer, and can be isolated from the diodes by trenches formed in accordance with the invention. As noted above, the substrate may have p-type doping rather than n-type, and other semiconductors may be used in accordance with the invention.

It is understood that the invention is not limited to the particular embodiments set forth herein as illustrative, but embraces all such forms thereof as come within the scope of the following claims.

What is claimed is:

1. Isolated semiconductor photodiode structure comprising:
   (a) a substrate of semiconductor having a high doping density of a selected impurity type;
   (b) a base layer of semiconductor meeting the substrate at a boundary and having the same impurity type as the substrate at a lower doping density than the substrate, wherein the base layer has a top surface and the base layer is at least as thick as the absorption length in the base layer of the light to which the structure will be exposed;
   (c) at least two spaced regions of semiconductor in contact with the base layer, the spaced regions doped with an impurity type opposite to the impurity type of the base layer such that each spaced region forms a p-n junction with the base layer; and
   (d) a trench in the base layer between the spaced regions that is not covered and that extends at least to the boundary between the substrate and the base layer, the trench spaced from the p-n junctions defined between the spaced regions and the base layer so that the trench does not expose a p-n junction, the width of the trench selected such that the path of minority carriers migrating from one side of the trench to the other through the substrate is greater than the diffusion length of the minority carriers in the substrate and wherein the trench has sidewalls that are parallel to each other and perpendicular to the top surface and a depth greater than its width.

2. The structure of claim 1 wherein the trench extends past the boundary and partially into the substrate.

3. The structure of claim 1 wherein the base layer has a top surface and wherein the trench has sidewalls that are parallel to each other and perpendicular to the top surface and a depth greater than its width.

4. The structure of claim 1 wherein the substrate has n+ type doping, the base layer has n type doping and the spaced regions have p type doping.

5. The structure of claim 1 wherein the trench has a width of about 2 microns.

6. The structure of claim 1 wherein there are multiple spaced regions arranged in a progression of adjacent spaced regions, and wherein a trench is formed between each of the adjacent spaced regions.

7. The structure of claim 1 wherein the trench extends around each spaced region.

8. The structure of claim 1 wherein the trench is formed by deep reactive ion etching and has polymer coated sidewalls.

9. The structure of claim 1 wherein the substrate and the base layer are formed of crystalline silicon.

10. The structure of claim 1 wherein the base layer is at least as thick as the absorption length in the base layer of the light to which the structure will be exposed.

11. The structure of claim 1 wherein the distance from the p-n junctions to the boundary between the substrate and the base layer is selected such that light photons of a selected wavelength that enter the base layer are absorbed before reaching the boundary.

12. The structure of claim 11 wherein the base layer is formed of crystalline silicon, the selected wavelength is red light and the distance between the p-n junctions and the boundary between the substrate and the base layer is at least 30 microns.

13. The structure of claim 1 wherein the base layer, substrate and spaced regions are formed of crystalline silicon, and including an insulating layer of silicon dioxide covering the base layer and the spaced regions, with openings in the silicon dioxide layer extending to the spaced regions in which metal contacts are formed.

14. The structure of claim 1 wherein the base layer is an epitaxial layer of silicon grown on a substrate of crystalline silicon.

15. The structure of claim 1 wherein the spaced regions are formed in the base layer and have a depth from a top surface of the base layer to the p-n junction of about 2 microns.

16. The structure of claim 1 wherein the lateral dimensions of the spaced regions are in the range of 2 to 20 microns, wherein the spacing between the spaced regions is in the range of 2 to 10 microns, and wherein the width of the trenches is in the range of 1 to 2 microns.

17. A semiconductor photodiode array comprising:
   (a) a substrate of semiconductor having a high doping density of a selected impurity type;
   (b) a base layer of semiconductor having a top surface and meeting the substrate at a boundary and having the same impurity type as the substrate at a lower doping density than the substrate;
   (c) multiple spaced regions of semiconductor in contact with the base layer in side-by-side progression, the spaced regions doped with an impurity type opposite to the impurity type of the base layer such that each spaced region forms a p-n junction with the base layer to define an array of diodes; and
   (d) trenches in the base layer between adjacent spaced regions that are not covered and that extend at least to the boundary between the substrate and the base layer, the trenches spaced from the p-n junctions defined between the spaced regions and the base layer so that the trenches do not expose a p-n junction, wherein the trenches have sidewalls that are parallel to each other and perpendicular to the top surface of the base layer and wherein the trenches have a width of 2 microns or less.

18. The photodiode array of claim 17 wherein the spaced regions defining diodes at the p-n junctions with the base layer are arranged in side-by-side progression in a circular pattern.

19. The photodiode array of claim 17 wherein the spaced regions defining diodes at the p-n junctions with the base layer are arranged in side-by-side progression in a linear pattern.

20. The photodiode array of claim 17 wherein the trenches extend past the boundary partially into the substrate and the depth of the trenches is greater than their width.

21. The photodiode array of claim 17 wherein the substrate has n+ type doping, the base layer has n-type doping and the spaced regions have p-type doping.

22. The photodiode array of claim 17 wherein the trenches have a width of about 2 microns.

23. The photodiode array of claim 17 wherein the trenches extend around each spaced region.

24. The photodiode array of claim 17 wherein the trenches are formed by deep reactive ion etching and have polymer coated sidewalls.

25. The photodiode array of claim 17 wherein the substrate and the base layer are formed of crystalline silicon.

26. The photodiode array of claim 17 wherein the distance from the p-n junctions to the boundary between the substrate and the base layer is selected such that light photons of a selected wavelength that enter the base layer are absorbed before reaching the boundary.

27. The photodiode array of claim 26 wherein the base layer is formed of crystalline silicon, the selected wavelength light is red light, and the distance between the p-n junctions and the boundary between the substrate and the base layer is at least 30 microns.

28. The photodiode array of claim 17 wherein the base layer, substrate and spaced regions are formed of crystalline silicon, and including an insulating layer of silicon dioxide covering the base layer and the spaced regions, with openings in the silicon dioxide layer extending to the spaced regions in which metal contacts are formed.

29. The photodiode array of claim 17 wherein the base layer is an epitaxial layer of silicon grown on a substrate of crystalline silicon.

30. The photodiode array of claim 17 wherein the spaced regions are formed in the base layer and have a depth from the top surface of the base layer to the p-n junctions of about 2 microns.

31. The photodiode array of claim 17 wherein the width of the trenches is selected such that the path of minority carriers migrating from one side of a trench to the other through the substrate is greater than the diffusion length of the minority carriers in the substrate.

32. The photodiode array of claim 17 wherein the lateral dimensions of the spaced regions are in the range of 2 to 20 microns, wherein the spacing between the spaced regions is in the range of 2 to 10 microns, and wherein the width of the trenches is in the range of 1 to 2 microns.

33. Isolated semiconductor photodiode structure comprising:
 (a) a substrate of silicon semiconductor having a high doping density of a selected impurity type;
 (b) a base layer of silicon semiconductor meeting the substrate at a boundary and having the same impurity type as the substrate at a lower doping density than the substrate, wherein the base layer has a top surface;
 (c) at least two spaced regions of semiconductor in contact with the base layer, the spaced regions doped with an impurity type opposite to the impurity type of the base layer such that each spaced region forms a p-n junction with the base layer, wherein the distance from the p-n junctions to the boundary between the substrate and the base layer is at least 30 microns such that red light photons that enter the base layer are absorbed before reaching the boundary; and
 (d) a trench in the base layer between the spaced regions that is not covered and that extends at least to the boundary between the substrate and the base layer, the trench spaced from the p-n junctions defined between the spaced regions and the base layer so that the trench does not expose a p-n junction, the width of the trench selected such that the path of minority carriers migrating from one side of the trench to the other through the substrate is greater than the diffusion length of the minority carriers in the substrate, wherein the trench has sidewalls that are parallel to each other and perpendicular to the top surface and a depth greater than its width.

34. The structure of claim 33 wherein the lateral dimensions of the spaced regions are in the range of 2 to 20 microns, wherein the spacing between the spaced regions is in the range of 2 to 10 microns, and wherein the width of the trenches is in the range of 1 to 2 microns.

35. A semiconductor photodiode array comprising:
 (a) a substrate of silicon semiconductor having a high doping density of a selected impurity type;
 (b) a base layer of silicon semiconductor having a top surface and meeting the substrate at a boundary and having the same impurity type as the substrate at a lower doping density than the substrate;
 (c) multiple spaced regions of semiconductor in contact with the base layer in side-by-side progression, the spaced regions doped with an impurity type opposite to the impurity type of the base layer such that each spaced region forms a p-n junction with the base layer to define an array of diodes, wherein the distance from the p-n junctions to the boundary between the substrate and the base layer is at least 30 microns such that red light photons that enter the base layer are absorbed before reaching the boundary; and
 (d) trenches in the base layer between adjacent spaced regions that are not covered and that extend at least to the boundary between the substrate and the base layer, the trenches spaced from the p-n junctions defined between the spaced regions and the base layer so that the trenches do not expose a p-n junction, wherein the trenches have sidewalls that are parallel to each other and perpendicular to the top surface of the base layer and wherein the trenches have a width of 2 microns or less.

36. The photodiode array of claim 35 wherein the lateral dimensions of the spaced regions are in the range of 2 to 20 microns, wherein the spacing between the spaced regions is in the range of 2 to 10 microns, and wherein the width of the trenches is in the range of 1 to 2 microns.

* * * * *

UNITED STATES PATENT AND TRADEMARK OFFICE
CERTIFICATE OF CORRECTION

PATENT NO. : 6,133,615
DATED : October 17, 2000
INVENTOR(S) : Guckel et al.

It is certified that error appears in the above-identified patent and that said Letters Patent is hereby corrected as shown below:

Column 1,
Line 4, after the title and before the "FIELD OF THE INVENTION" add:

-- STATEMENT OF GOVERNMENT RIGHTS

This invention was made with United States government support awarded by the following agencies: DOD DOD-AF# F33615-95-C-1764; ARMY# DABT63-93-C-0066; DOE AV-5723; ONR N00014-93-1-0911. The United States government has certain rights in this invention. --

Signed and Sealed this

Tenth Day of June, 2003

JAMES E. ROGAN
*Director of the United States Patent and Trademark Office*